United States Patent
Lee et al.

(10) Patent No.: US 9,899,396 B1
(45) Date of Patent: Feb. 20, 2018

(54) SEMICONDUCTOR DEVICE, FABRICATING METHOD THEREOF, AND FABRICATING METHOD OF MEMORY

(71) Applicant: MACRONIX International Co., Ltd., Hsinchu (TW)

(72) Inventors: Chih-Hsiung Lee, Hsinchu (TW); Chien-Ying Lee, Hsinchu (TW); Tzung-Ting Han, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/366,682

(22) Filed: Dec. 1, 2016

(51) Int. Cl.
| | | |
|---|---|---|
| H01L 27/088 | (2006.01) | |
| H01L 27/11524 | (2017.01) | |
| H01L 27/11548 | (2017.01) | |
| H01L 21/762 | (2006.01) | |
| H01L 29/788 | (2006.01) | |
| H01L 29/06 | (2006.01) | |
| H01L 29/66 | (2006.01) | |

(52) U.S. Cl.
CPC .. *H01L 27/11524* (2013.01); *H01L 21/76224* (2013.01); *H01L 27/11548* (2013.01); *H01L 29/0649* (2013.01); *H01L 29/66825* (2013.01); *H01L 29/788* (2013.01)

(58) Field of Classification Search
CPC ........... H01L 2924/00; H01L 27/11521; H01L 27/11526; H01L 21/823481; H01L 29/66825
See application file for complete search history.

(56) References Cited

U.S. PATENT DOCUMENTS

| | | | | |
|---|---|---|---|---|
| 8,202,784 B2* | 6/2012 | Kim | ................. | H01L 21/76224 257/E21.548 |
| 8,592,918 B2* | 11/2013 | Yuan | ................. | H01L 21/76229 257/374 |
| 2007/0232019 A1 | 10/2007 | Cho | | |
| 2009/0170321 A1 | 7/2009 | Cho et al. | | |
| 2009/0194810 A1* | 8/2009 | Kiyotoshi | ......... | H01L 21/76229 257/326 |
| 2014/0231919 A1* | 8/2014 | Peng | ................. | H01L 21/76224 257/368 |
| 2017/0018452 A1* | 1/2017 | Dou | ................. | H01L 29/42356 |

* cited by examiner

Primary Examiner — Jaehwan Oh
(74) Attorney, Agent, or Firm — J.C. Patents

(57) ABSTRACT

A method for fabricating a semiconductor device includes: forming a first trench and a wider second trench in a substrate and a material layer formed thereon, forming a flowable isolation material covering the material layer and filling in the first and second trenches, removing a portion of the flowable isolation material in the second trench so that the thickness of the remaining flowable isolation material on the sidewall of the second trench is 200 Å to 1000 Å, and forming a non-flowable isolation material on the flowable isolation material.

14 Claims, 6 Drawing Sheets

SEMICONDUCTOR DEVICE, FABRICATING METHOD THEREOF, AND FABRICATING METHOD OF MEMORY

BACKGROUND OF THE INVENTION

Field of Invention

This invention relates to a semiconductor device and a method for fabricating the same, and a method for fabricating a memory that is based on the same method.

Description of Related Art

In current semiconductor processes, isolation structures are usually formed in the substrate to define a core area and a peripheral area. For example, in a non-volatile memory (NVM) fabricating process, a memory area is defined between isolation structures having a large layout area, and isolation structures having a smaller layout area are formed in the memory area. As the device dimensions are reduced unceasingly, formation of the isolation structures usually included filling trenches formed in the substrate with an isolation material to prevent formation of voids in the isolation structures. Various techniques have been developed in the isolation structures to improve device performances.

SUMMARY OF THE INVENTION

Accordingly, this invention provides a method for fabricating a semiconductor device, which can prevent the sidewall and bottom of the trench from being damaged in forming the isolation structures and prevent dislocation in the substrate that is caused by a stress induced by the isolation structures.

This invention also provides a semiconductor device that is fabricated with the above method of this invention.

This invention also provides a method for fabricating a memory, which is based on the above method and allows the memory to have higher reliability.

The method for fabricating a semiconductor device of this invention is described below. A material layer is formed on the substrate. A first trench and a second trench are formed in the material layer and the substrate, wherein the width of the first trench is smaller than the width of the second trench. A flowable isolation material is formed covering the material layer and filling in the first and second trenches. A portion of the flowable isolation material in the second trench is removed so that the thickness of the remaining flowable isolation material on the sidewall of the second trench is 200 Å to 1000 Å. A non-flowable isolation material is formed on the flowable isolation material.

In an embodiment of the above method, after the portion of the flowable isolation material in the second trench is removed, the distance between the surface of the remaining flowable isolation material on the bottom of the second trench and the top surface of the substrate is larger than ⅓ of the distance between the top surface of the substrate and the bottom of the second trench.

In an embodiment of the above method, the method of removing the portion of the flowable isolation material in the second trench includes the following steps. A patterned mask layer that exposes a portion of the flowable isolation material above the second trench is formed on the flowable isolation material. Anisotropic etching is then performed with the patterned mask layer as an etching mask.

The semiconductor device of this invention includes a material layer disposed on a substrate, a first isolation material layer, and a second isolation material layer. The material layer and the substrate have therein a first trench and a second trench, wherein the width of the first trench is smaller than the width of the second trench. The first isolation material layer is disposed in the first trench and on the sidewall and the bottom of the second trench. The second isolation material layer is disposed on the first isolation material layer in the second trench. The thickness of the first isolation material layer on the sidewall of the second trench is in the range of 200 Å to 1000 Å.

In an embodiment of the above semiconductor device, the distance between the top surface of the first isolation material layer on the bottom of the second trench and the top surface of the substrate is larger than ⅓ of the distance between the top surface of the substrate and the bottom of the second trench.

The method for fabricating a memory of this invention is described below. A gate dielectric material layer and a gate material layer are formed in sequence on a substrate. A plurality of first trenches and a plurality of second trenches are formed in the gate material layer, the gate dielectric material layer and the substrate, wherein a plurality of floating gates and a gate dielectric layer are defined, and the width of the first trenches is smaller than the width of the second trenches. A flowable isolation material is filled in the first and second trenches. A portion of the flowable isolation material in each second trench is removed, so that the thickness of the remaining flowable isolation material on the sidewall of the second trench is in the range of 200 Å to 1000 Å. A non-flowable isolation material is formed in the remaining portion of the flowable isolation material in each second trench. A portion of the flowable isolation material in each first trench is removed. An inter-gate dielectric layer is formed on each floating gate. A plurality of control gates is formed on the inter-gate dielectric layer.

In an embodiment of the above method, after the portion of the flowable isolation material in each second trench is removed, the distance between the top surface of the remaining flowable isolation material on the bottom of the second trench and the top surface of the substrate is larger than ⅓ of the distance between the top surface of the substrate and the bottom of the second trench.

In an embodiment of the above method, the method of removing the portion of the flowable isolation material in each second trench includes the following steps. A patterned mask layer that exposes a portion of the flowable isolation material above the second trench is formed on the flowable isolation material. Anisotropic etching is then performed with the patterned mask layer as an etching mask.

Because a portion of the flowable isolation material in the wider trench is removed after the flowable isolation material is applied, the stress caused by the cured flowable isolation material in the wider trench can be effectively reduced to suppress dislocation in the substrate. Consequently, the device reliability can be improved.

In order to make the aforementioned and other objects, features and advantages of this invention comprehensible, a preferred embodiment accompanied with figures is described in detail below.

DESCRIPTION OF EMBODIMENTS

This invention is further explained with the following embodiments, which are not intended to limit the scope thereof.

Figure 1A:
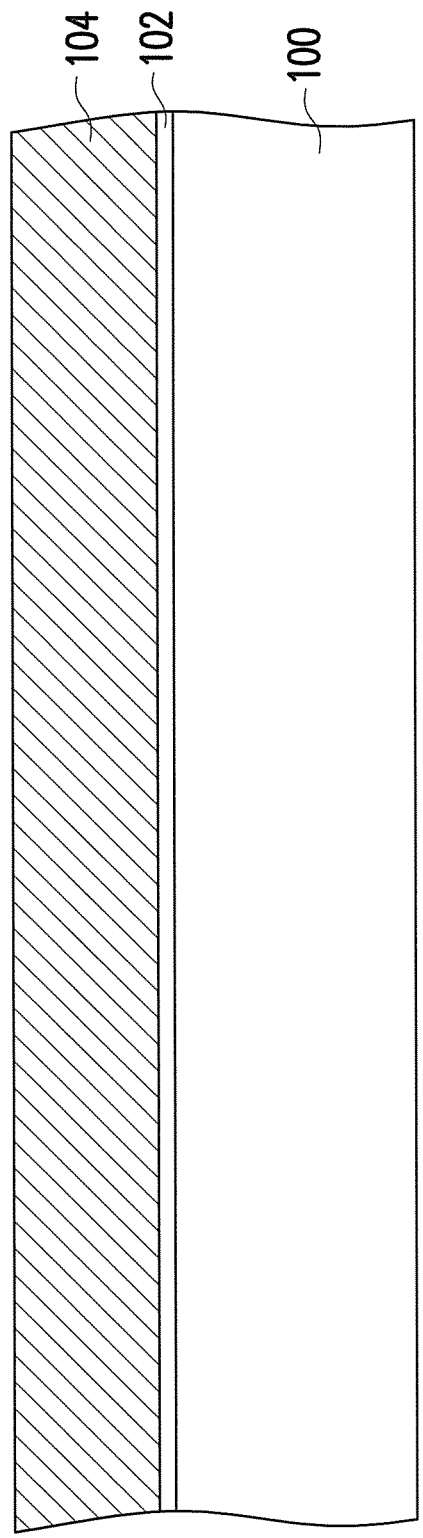
FIGS. 1A to 1F illustrate, in a cross-sectional view, a method for fabricating a memory according to an embodiment of this invention, wherein FIG. 1F also illustrates a structure of the memory according to the embodiment of this invention.
Figure 1B:
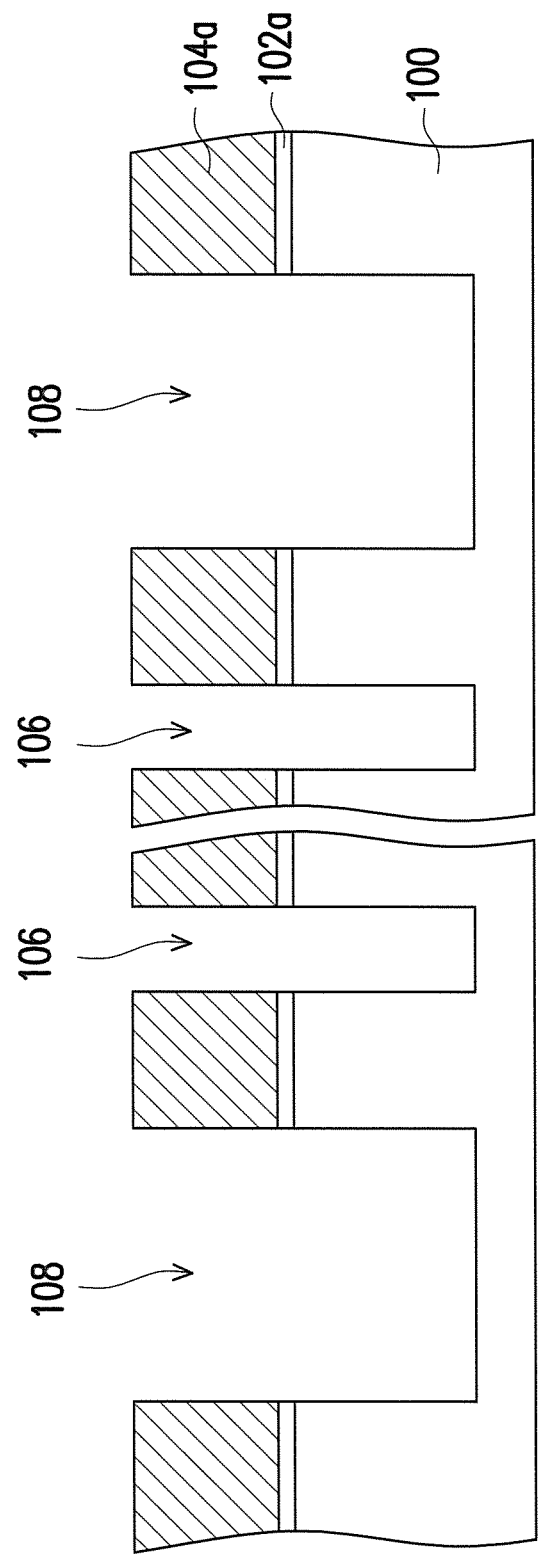
Figure 1C:
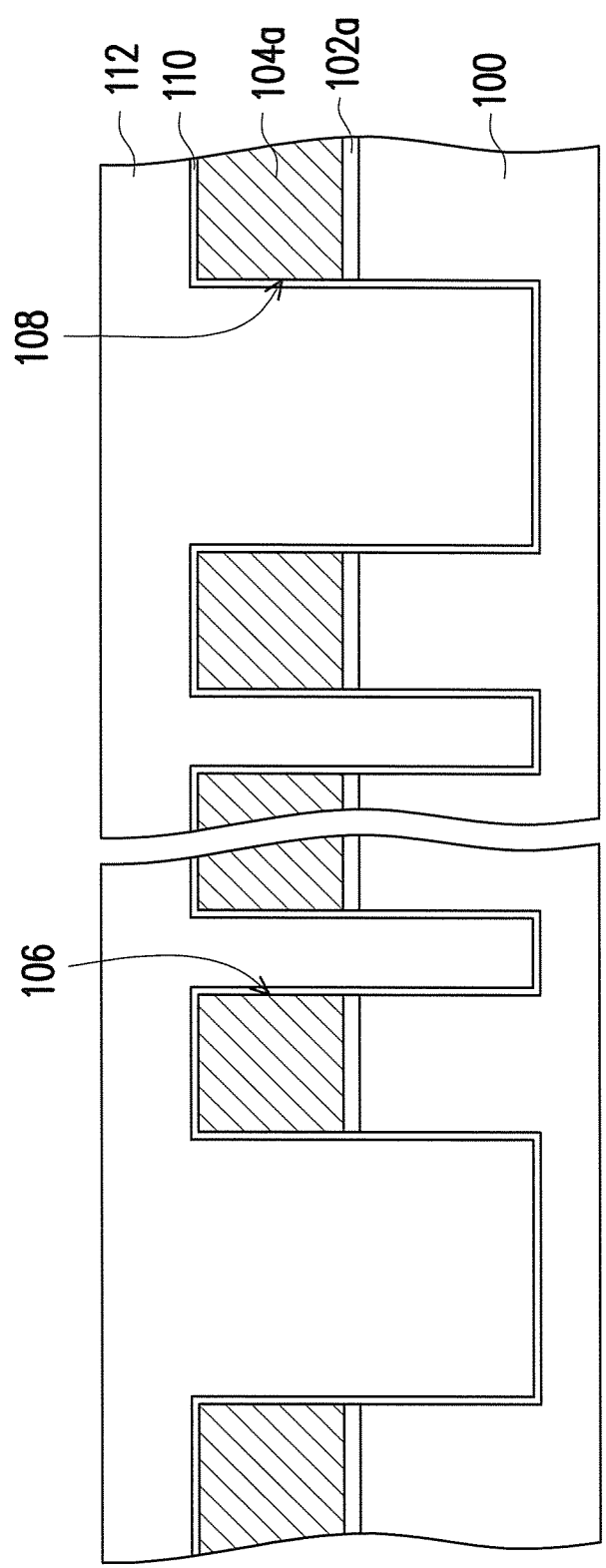
Figure 1D:
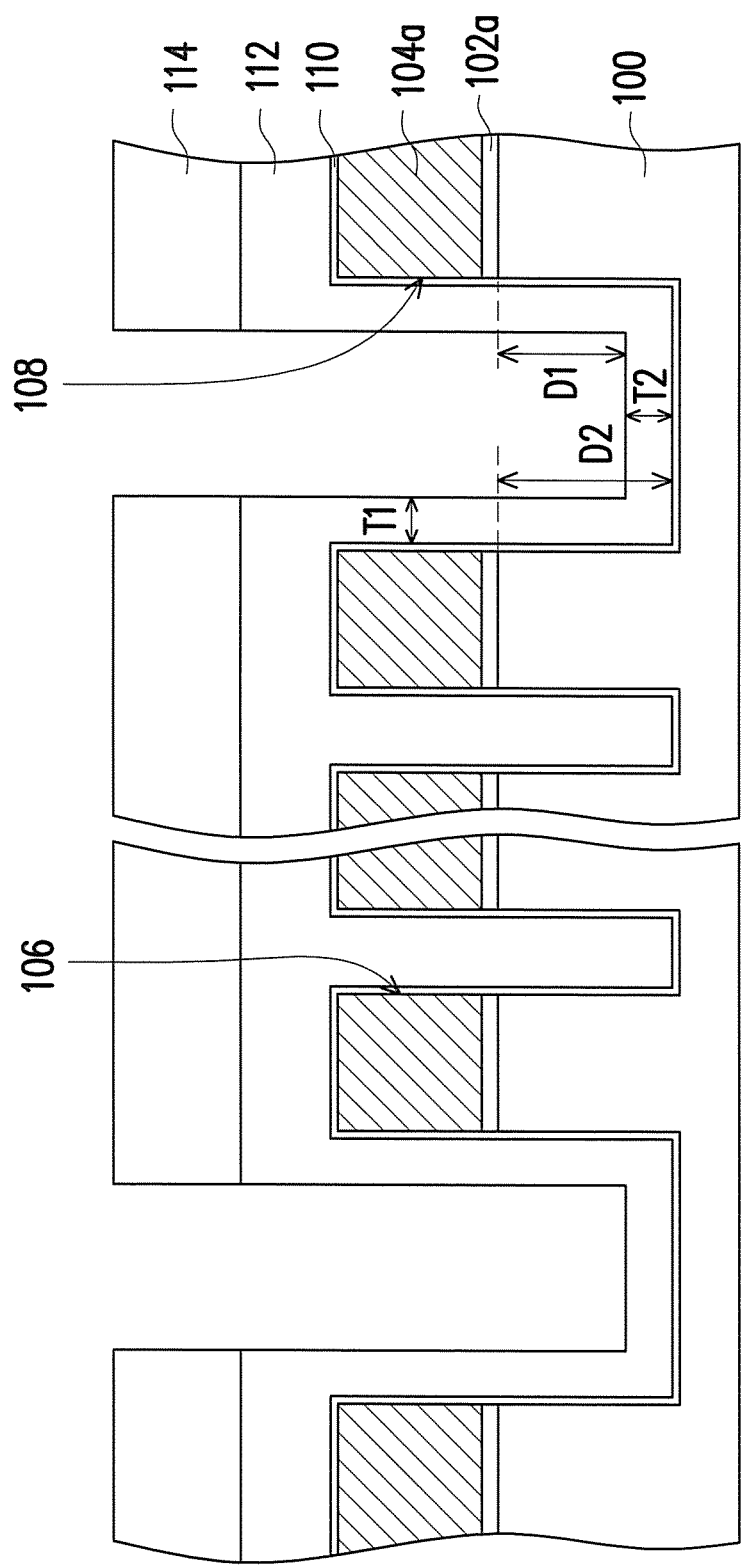
Figure 1E:
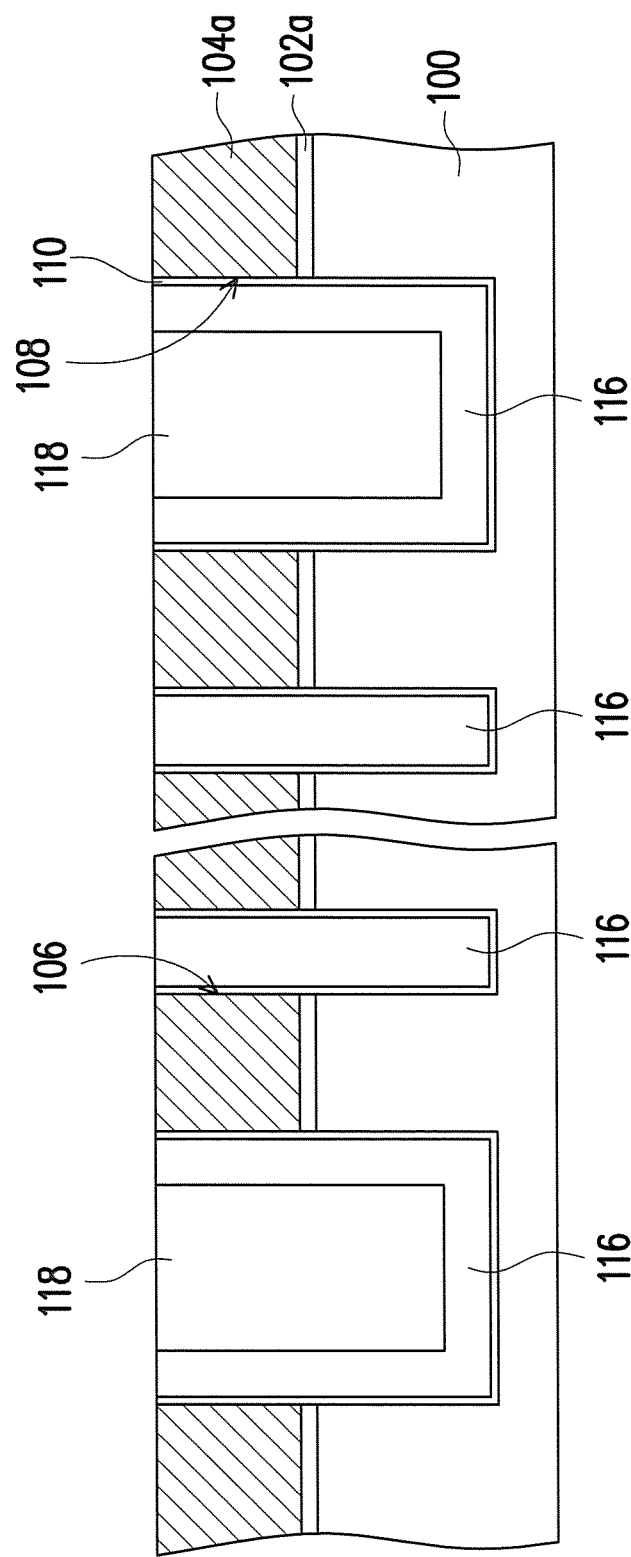
Figure 1F:
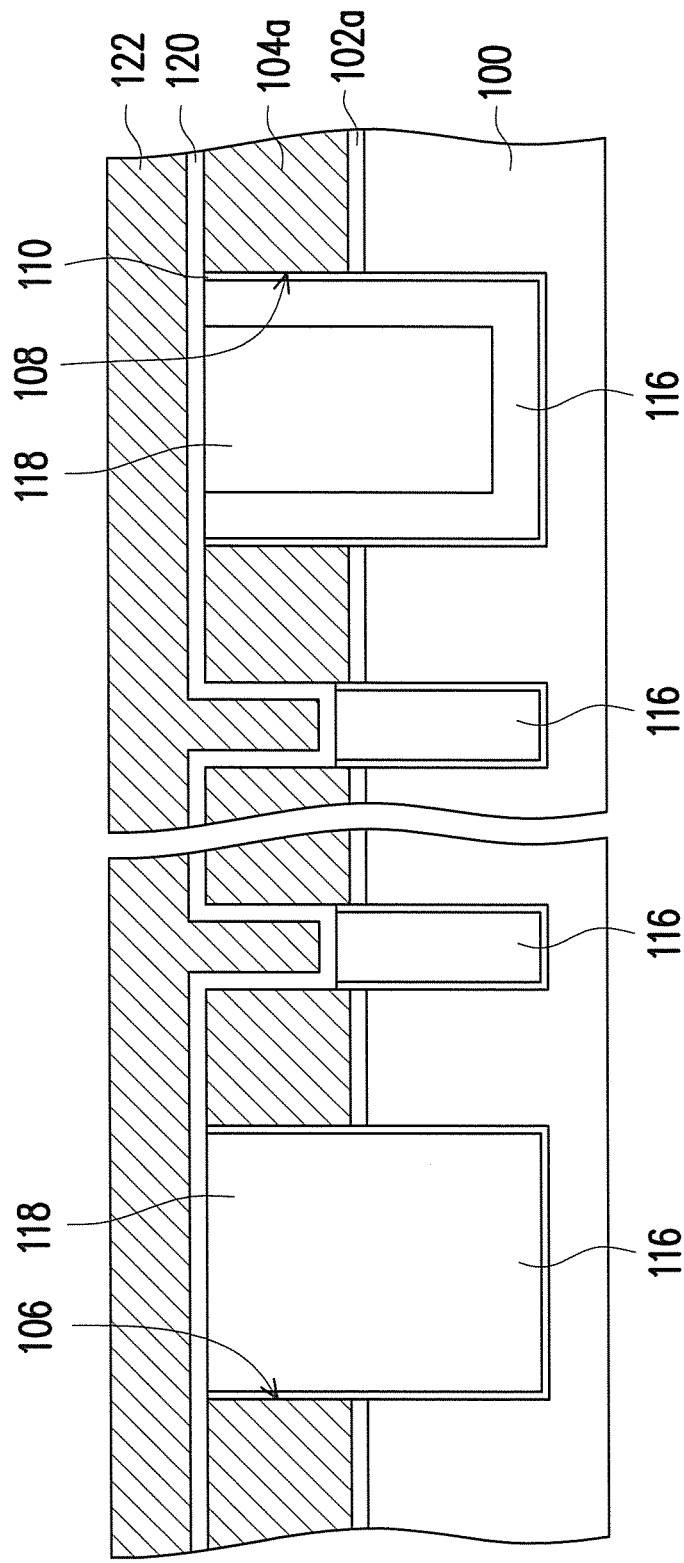

FIGS. 1A to 1F illustrate, in a cross-sectional view, a method for fabricating a memory according to an embodiment of this invention, wherein FIG. 1F also illustrates a structure of the memory according to the embodiment of this invention.

Referring to FIG. 1A, a material layer is formed on a substrate 100, which may be a silicon substrate, for example. In this embodiment, the material layer includes a gate dielectric material layer 102 and a gate material layer 104 that are formed on the substrate 100 in sequence. In other embodiment where the semiconductor device to be formed is not NVM, the material layer of this invention can be another kind of film as practically required. In this embodiment, the gate dielectric material layer 102 may be an oxide layer, and the gate material layer 104 may be a poly-Si layer or a metal layer, for example. In an example of non-volatile memory, the gate dielectric material layer 102 acts as a tunneling dielectric layer in a memory area. Electrons could tunnel through the tunneling dielectric layer and could be stored in a floating gate. In logic device, the gate dielectric material layer 102 acts as a gate dielectric in a field effect transistor (FET). In some examples, a hard mask layer (not shown) is formed on the gate material layer 104. The hard mask layer may include a composition of oxygen or nitrogen.

Referring to FIG. 1B, a plurality of first trenches 106 and a plurality of second trenches 108 are formed in the gate material layer 104, the gate dielectric material layer 102 and the substrate 100, wherein the width of the first trenches 106 is smaller than the width of the second trenches 108. It is noted that for simplicity of the drawing, only two first trenches 106 and two second trenches 108 are illustrated in the figure, but the numbers of the first trenches 106 and the second trenches 108 are not limited thereto. In this embodiment, the second trenches 108 surround the first trenches 106, and the first trenches 106 and the second trenches 108 define, on the substrate, a memory area having the first trenches 106 therein and a peripheral area having the second trenches 108 therein. The method for forming the first trenches 106 and the second trenches 108 includes, for example, performing a lithography-etching process to the gate material layer 104, the gate dielectric material layer 102 and the substrate 100. Due to the formation of the first trenches 106 and the second trenches 108, the gate material layer 104 and the gate dielectric material layer 102 are defined into a plurality of floating gates 104a and a gate dielectric layer 102a under each floating gate 104a, respectively.

Referring to FIG. 1C, a buffer layer 110 is optionally formed over the substrate 100. In this embodiment, the buffer layer 110 is formed conformally over the substrate 100, covering the floating gates 104a, the gate dielectric layer 102a and the substrate 100. The buffer layer 110 is, e.g., an oxide layer, and may be formed with, e.g., atomic layer deposition (ALD) or high-temperature oxidation (HTO). The thickness of the buffer layer 110 may range from 20 Å to 100 Å, for example. A flowable isolation material 112 is then formed over the substrate 100, covering the floating gates 104a and filling in the first trenches 106 and the second trenches 108. The flowable isolation material 112 may be, e.g., an oxide material, which may be applied to the substrate 100 through, e.g., spin-on coating. The flowable isolation material 112 may include a silicate, a siloxane or a methylsilsesquioxane (MSQ). Since the flowable isolation material 112 has a higher flowability compared to a deposited material, it can effectively fill into the first trenches 106 and the second trenches 108 and prevents formation of voids in the narrower first trenches 106. Thereafter, a semi-curing treatment may optionally be performed to the flowable isolation material 112. The semi-curing may be performed under water vapor or oxygen gas at a temperature of 200° C. to 300° C. for 10 to 30 minutes, for example.

It is particularly noted that forming the buffer layer 110 prior to the flowable isolation material 112 as in this embodiment can prevent the flowable isolation material 112 from entering the floating gates 104a, the gate dielectric layer 102a or the substrate 100 in the process and lowering the device reliability.

In addition, in the semi-curing treatment for the flowable isolation material 112, the flowable isolation material 112 in the wider second trenches 108 induces a larger stress so that dislocation is generated in the surrounding substrate 100 and floating gates 104a. Hence, a portion of the flowable isolation material 112 in each second trench 108 is removed with subsequent steps described later to reduce the stress.

Referring to FIG. 1D, a patterned mask layer 114 is formed on the semi-cured flowable isolation material 112, exposing a part of the flowable isolation material 112 above each second trench 108, for example, a part of the flowable isolation material 112 above a central part of each second trench 108. The patterned mask layer 114 may be, e.g., a patterned photoresist layer. Then, an anisotropic etching process is performed using the patterned mask layer 114 as an etching mask to remove a portion of the exposed flowable isolation material 112. The portion of the flowable isolation material 112 remaining in each second trench 108 after the anisotropic etching process satisfies the following requirements: that the thickness T1 of the remaining flowable isolation material 112 on the sidewall of the second trench 108 is in the range of 200 Å to 1000 Å, and that the distance D1 between the top surface of the remaining flowable isolation material 112 on the bottom of the second trench 108 and the top surface of the substrate 100 is larger than ⅓ of the distance D2 between the top surface of the substrate 100 and the bottom of the second trench 108. The thickness T1 of the remaining flowable isolation material 112 on sidewalls of the second trench 108 is preferably substantially uniform. In addition, in this embodiment, the thickness T2 of the flowable isolation material 112 on bottom of the second trench 108 may be larger than 200 Å, for example.

If the thickness T1 exceeds 1000 Å, the stress cannot be effectively reduced. If the thickness T1 is less than 200 Å, the substrate 100, the gate dielectric layer 102a and the floating gates 104a at the sidewall of the second trench 108 may possibly be damaged in the etching process, and dopant loss may occur in cases where the substrate 100 or the floating gates 104a contain dopants. Moreover, if the distance D1 is not larger than ⅓ of the distance D2, too much of the flowable isolation material 112 remains in the second trench 108 so that the 1 of the stress cannot be effectively reduced. However, the thickness T2 is preferably larger than 200 Å, so as to prevent the substrate 100 under the second trench 108 from being damaged in the etching process. In other words, when the thickness T1, the thickness T2 and the distance D1 are within the above ranges, the stress can be effectively reduced, the substrate 100, the gate dielectric layer 102a and the floating gates 104a can be prevented from damages in the etching process, and dopant loss from the substrate 100 or floating gates 104a can be prevented, so that the reliability of the subsequently finished devices is improved.

Referring to FIG. 1E, after the portion of the flowable isolation material 112 in each second trench 108 is removed, the patterned mask layer 114 is removed. A curing treatment is then performed to the flowable isolation material 112. The above curing treatment may be a multi-stage curing treatment, which may include, e.g., a first stage under water vapor or oxygen gas at a temperature of 300° C. to 500° C. for 10 to 30 min, a second stage under water vapor or oxygen gas at a temperature of 500° C. to 800° C. for 10 to 30 min, and then a third stage under nitrogen gas at a temperature of 800° C. to 1100° C. for 30 to 60 min.

Thereafter, a non-flowable isolation material is formed on the cured flowable isolation material 112, filling in each second trench 108. The non-flowable isolation material may be a high-density plasma (HDP) oxide material or an oxide material formed with an enhanced high aspect ratio process (eHARP). Then, a planarization process such as a chemical mechanical polishing (CMP) process is performed to remove the non-flowable isolation material, the cured flowable isolation material 112 and the buffer layer 110 outside of the second trenches 108, until the floating gates 104a are exposed. As a result, in each second trench 108 are formed an isolation structure 116 that includes the cured flowable isolation material 112 remaining in the second trench 108, and an isolation structure 118 that is disposed on the isolation structure 116 and includes the non-flowable isolation material 112 remaining in the second trench 108.

Referring to FIG. 1F, a portion of the isolation structure 116 in each first trench 106 and a portion of the buffer layer 110 in each first trench 106 are removed to expose at least a part of the sidewall of each of the floating gates 104a around the first trench 106. An inter-gate dielectric layer 120 is then formed on a top surface and sidewalls of each floating gate 104a. The method for forming the inter-gate dielectric layer 120 may include: performing a chemical vapor deposition (CVD) to form a multi-layer conformally over the top surface and the sidewalls of each floating gate 104a. The inter-gate dielectric layer 120 may include a nitride layer sandwiched by two oxide layers. A plurality of control gates 122 is then formed on the inter-gate dielectric layer 120. The control gates 122 may include, e.g., poly-Si, and may be formed with, e.g., a CVD process and a subsequent patterning process. The removed portion of the isolation structure 116 in each first trench 106 and the removed portion of the buffer layer 110 may increase a contacting surface between the floating gate 104a and the control gates 122. Hence, a coupling ratio between the floating gate 104a and the control gates 122 is improved. The device may have a better performance.

Though fabrication of a non-volatile memory (NVM) is taken as an example in the above embodiment to describe the method for fabricating a semiconductor device of this invention, the semiconductor device of this invention is not limited to an NVM device. By replacing one or more layers in the above embodiment based on practical requirements and following the steps as shown in FIG. 1A to FIG. 1E, another kind of semiconductor device may be formed. For example, when the above material layer is a poly-Si layer, by performing the steps as shown in FIG. 1A to FIG. 1E under suitable process conditions, a plurality of isolation structures, and MOS transistors disposed on the active areas of the substrate defined by the isolation structures can be formed.

This invention has been disclosed above in the preferred embodiments, but is not limited to those. It is known to one skilled in the art that some modifications and innovations may be made without departing from the spirit and scope of this invention. Hence, the scope of this invention should be defined by the following claims.

What is claimed is:

1. A method for fabricating a semiconductor device, comprising:
   forming a material layer on a substrate;
   forming a first trench and a second trench in the substrate and the material layer, wherein a width of the first trench is smaller than a width of the second trench;
   forming a flowable isolation material covering the material layer and filling in the first trench and the second trench;
   removing a portion of the flowable isolation material in the second trench, so that a thickness of the remaining flowable isolation material on a sidewall of the second trench is in a range of 200 Å to 1000 Å; and
   forming a non-flowable isolation material on the flowable isolation material.

2. The method of claim 1, wherein after removing the portion of the flowable isolation material in the second trench, a distance between a top surface of the remaining flowable isolation material on a bottom of the second trench and a top surface of the substrate is larger than ⅓ of a distance between the top surface of the substrate and the bottom of the second trench.

3. The method of claim 1, wherein the thickness of the remaining flowable isolation material on a bottom of the second trench is larger than 200 Å.

4. The method of claim 1, further comprising:
   after the first and second trenches are formed but before the flowable isolation material is formed, forming a buffer layer on the substrate and the material layer.

5. The method of claim 1, further comprising:
   after the flowable isolation material is formed but before the portion of the flowable isolation material in the second trench is removed, performing a semi-curing treatment to the flowable isolation material.

6. The method of claim 1, wherein removing the portion of the flowable isolation material in the second trench comprises:
   forming, on the flowable isolation material, a patterned mask layer that exposes a portion of the flowable isolation material above the second trench; and
   performing anisotropic etching with the patterned mask layer as an etching mask.

7. The method of claim 1, wherein the thickness of the remaining flowable isolation material on the sidewall of the second trench is uniform.

8. A method for fabricating a memory, comprising:
   forming a gate dielectric material layer and a gate material layer in sequence on a substrate;
   forming a plurality of first trenches and a plurality of second trenches in the gate material layer, the gate dielectric material layer and the substrate, wherein a plurality of floating gates and a gate dielectric layer are defined, and a width of the first trenches is smaller than a width of the second trenches;
   filling a flowable isolation material in the first trenches and the second trenches;

removing a portion of the flowable isolation material in each second trench, so that a thickness of the remaining flowable isolation material on a sidewall of the second trench is in a range of 200 Å to 1000 Å;

forming a non-flowable isolation material in a remaining portion of the flowable isolation material in each second trench;

removing a portion of the flowable isolation material in each first trench;

forming an inter-gate dielectric layer on each floating gate; and forming a plurality of control gates on the inter-gate dielectric layer.

9. The method of claim 8, wherein after removing the portion of the flowable isolation material in each second trench, a distance between a top surface of the remaining flowable isolation material on a bottom of the second trench and a top surface of the substrate is larger than ⅓ of a distance between the top surface of the substrate and the bottom of the second trench.

10. The method of claim 8, wherein the thickness of the remaining flowable isolation material on a bottom of each second trench is larger than 200 Å.

11. The method of claim 8, further comprising:
after the first trenches and the second trenches are formed but before the flowable isolation material is filled in the first trenches and the second trenches, forming a buffer layer on the substrate, the floating gates and the gate dielectric layer.

12. The method of claim 8, further comprising:
after the flowable isolation material is filled in the first trenches and the second trenches but before the portion of the flowable isolation material in each second trench is removed, performing a semi-curing treatment to the flowable isolation material.

13. The method of claim 8, wherein removing the portion of the flowable isolation material in each second trench comprises:

forming, on the flowable isolation material, a patterned mask layer that exposes a portion of the flowable isolation material above the second trench; and performing anisotropic etching with the patterned mask layer as an etching mask.

14. The method of claim 8, wherein the thickness of the remaining flowable isolation material on the sidewall of each second trench is uniform.

* * * * *